United States Patent
Hartwell

(10) Patent No.: US 8,822,948 B1
(45) Date of Patent: Sep. 2, 2014

(54) METHOD AND APPARATUS FOR CONTROL OF A PLASMA FOR SPECTROMETRY

(71) Applicant: Thermo Electron Manufacturing Limited, Cambridge (GB)

(72) Inventor: Stephen Hartwell, Cambridge (GB)

(73) Assignee: Thermo Electron Manufacturing Limited, Cambridge (GB)

(*) Notice: Subject to any disclaimer, the term of this patent is extended or adjusted under 35 U.S.C. 154(b) by 0 days.

(21) Appl. No.: 14/074,824

(22) Filed: Nov. 8, 2013

(30) Foreign Application Priority Data

Mar. 15, 2013 (GB) .................................. 1304701.4

(51) Int. Cl.
*C23C 14/54* (2006.01)
*C23C 8/36* (2006.01)
*H01L 21/203* (2006.01)

(52) U.S. Cl.
USPC ......... 250/424; 250/306; 250/307; 250/423 R

(58) Field of Classification Search
USPC ............................ 250/306, 307, 423 R, 424
See application file for complete search history.

(56) References Cited

U.S. PATENT DOCUMENTS

| | | | |
|---|---|---|---|
| 4,419,582 A * | 12/1983 | Janes et al. ..................... | 250/424 |
| 5,446,538 A | 8/1995 | Noll | |
| 6,064,072 A * | 5/2000 | Partlo et al. ............... | 250/504 R |
| 6,254,703 B1 * | 7/2001 | Sokol et al. .................... | 148/508 |
| 6,452,199 B1 * | 9/2002 | Partlo et al. ............... | 250/504 R |
| 6,566,667 B1 * | 5/2003 | Partlo et al. ............... | 250/504 R |
| 7,608,839 B2 * | 10/2009 | Coulombe et al. ............ | 250/426 |
| 2006/0049480 A1 * | 3/2006 | Naka et al. ..................... | 257/521 |
| 2007/0029500 A1 * | 2/2007 | Coulombe et al. ......... | 250/423 F |

FOREIGN PATENT DOCUMENTS

| | | |
|---|---|---|
| JP | H08330278 A | 12/1996 |
| JP | H09186136 A | 7/1997 |
| JP | H10083893 A | 3/1998 |
| JP | 2001335932 A | 12/2001 |
| JP | 2008133518 A | 6/2008 |

* cited by examiner

*Primary Examiner* — David A Vanore
(74) *Attorney, Agent, or Firm* — Charles B. Katz

(57) ABSTRACT

A method of and apparatus for controlling the temperature of an inductively coupled or microwave induced plasma for optical emission spectrometry or mass spectrometry in which the intensities of two spectral lines of radiation emitted by the plasma are measured, and the power provided to sustain the plasma is adjusted so that the ratio of the intensities remains substantially constant.

26 Claims, 2 Drawing Sheets

METHOD AND APPARATUS FOR CONTROL OF A PLASMA FOR SPECTROMETRY

FIELD OF THE INVENTION

This invention relates to the control of a plasma for spectrometry and in particular to control the plasma temperature and free electron density. The invention may be used to control inductively coupled plasmas and microwave induced plasmas, such as are used in optical emission spectrometry (ICP-OES and MIP-OES) and in mass spectrometry (ICP-MS and MIP-MS).

BACKGROUND TO THE INVENTION

ICP-OES, MIP-OES, ICP-MS and MIP-MS are well known techniques for elemental analysis of samples providing quantified determinations of elements present in liquid or solid samples trace levels (ppb or ppt). Small particles of solid sample or droplets of liquid sample are introduced into a plasma whereupon they are atomized, excited, and a proportion are ionized. Excited atoms and ions emit photons characteristic of the elements present and the optical emission produced is analyzed in ICP-OES and MIP-OES using an optical spectrometer. Ions are introduced into a vacuum system containing a mass spectrometer for mass analysis.

In the case of inductively coupled plasmas, the plasma is produced in an inert gas, usually argon, by means of the inductive coupling of power from an RF current driven through a coil surrounding the inert gas. The inert gas is present in the form of a flow of gas through a torch, the coil surrounding the torch at a gas outlet from the torch. Hence the torch has an axis along which the gas flows, and the coil has an axis; usually the torch and the coil are arranged coaxially. The torch usually comprises three concentric coaxial tubes, each of which is supplied with a continuous flow of inert gas. A continuous plasma may be formed, and sample is introduced into the plasma along the torch axis in the innermost concentric tube of the torch.

Microwave induced plasmas utilize GHz frequency radiation coupled using a waveguide to a cavity in connection with a torch. Continuous plasma powers of a few hundred Watts to over 1 kW may be generated. Various different types of physical arrangements of waveguides, cavities and torches have been used. In common with ICP apparatus, an inert gas, usually helium, nitrogen or argon, is typically used to form the plasma (although high levels of impurity can be tolerated so that air can be used), and sample material in the form of small droplets, small solid particles, or gases are passed into the plasma for excitation and ionization.

Where the sample is in liquid form, droplets of the liquid are produced using a nebulizer or a droplet dispenser, and the droplets are entrained in the flow of inert gas which supplies the innermost concentric tube of the torch. The droplets of liquid are taken into the axial region of the plasma by the gas flow, whereupon they are desolvated, atomized, ionized and excited.

Where the sample is in solid form, small particles of solid are liberated from the sample by, for example, laser or spark ablation, and carried into the axial region of the plasma by entrainment in the inert gas supplying the innermost concentric tube of the torch. The solid particles receive sufficient energy from the plasma to cause atomization, ionization and excitation.

The excited sample atoms relax to lower electronic states by the emission of photons, and the energy of the photons (the wavelength of the optical emission) is characteristic of the elements from which they came. In ICP-OES and MIP-OES, optical emission from the sample material in the plasma is directed, using optical elements such as lenses and mirrors, onto an optically dispersive element, such as a grating, and dispersed photons arrive at one or more detectors in the form of spectral lines, separated from one another in space. The use of spatially resolving detectors such as an array of CCD or CID detectors enables simultaneous detection of a spectrum or parts of a spectrum.

Optical emission from the plasma may be viewed along or near the axis of the plasma (axial viewing), or optical emission from the plasma which is emitted radially from the plasma may be viewed, (radial viewing). Some spectrometers have facilities for both axial and radial viewing. The spectrometer is usually controlled by one or more computers.

Quantification of the amount of an element present in the sample material is determined by measuring the intensity of one or more of the spectral lines related to that element, the number depending on how many elements are to be quantified and the degree of spectral and chemical interferences. For a single element analyte a simple calibration curve can be constructed relating the intensity to the concentration. When multiple elements are present there is the possibility of spectral interference (where one spectral line overlaps another). Typically this is corrected by measuring the interfering element at two lines, one of which is not interfered with. The level of interference at the line of interest is calculated by multiplying the intensity at the non-interfering line by a constant.

In ICP-MS and MIP-MS, a mixture of atoms, ions and plasma gas is admitted into successive stages of a vacuum system. In the first stage the plasma plays upon a cooled metal cone, the cone positioned upon the axis of the plasma. The cone has an orifice large enough to enable a boundary layer of the plasma to be penetrated so that material from the plasma passes into an evacuated expansion chamber. The material expands in the lower pressure region and forms a supersonic jet. A portion of the jet is skimmed using another metal cone into the next vacuum stage maintained at a lower pressure, where typically it encounters an ion extraction lens. Electrons are turned out of the beam path due to the electric field produced by the lens. Often the remaining beam of ions and neutral particles is then admitted to an ion-neutral separator which diverts charged particles through a path using electric fields, whilst neutral particles are unaffected. Ions are then admitted to a further vacuum chamber at still lower pressure, in which a mass analyser, such as a quadrupole mass filter, is located, together with a detector. Other, more complex systems including collision/reaction cells and/or different types of mass analyser are also well known. Mass analyzers separate the different ions on the basis of their mass-to-charge ratio. For simplicity, and as most ions are singly charged, this will herein be referred to as the mass of the ions.

When a continuous source of sample material is passed into the plasma, the stability of the detected optical signals from sample material (ICP-OES, MIP-OES) and the stability of the detected ion mass signals (ICP-MS, MIP-MS) are dependent, amongst other things, upon the stability of the plasma.

In most ICP-OES and ICP-MS instruments the plasma stability is controlled by controlling the RF power driven through the coil which generates the plasma. The RF power is supplied to the coil from an RF generator, the power being around 1 kW. At these power levels it is important to match the impedance of the RF generator to the impedance of the combination of any electrical conductors used together with the coil and the plasma. Changes in the plasma cause the impedance of the coil and plasma combination to change, and for efficient power transfer, the impedance of the RF generator must be altered.

Presently, widely used RF generators either use a crystal-controlled frequency drive together with a variable impedance matching network, or they use a free-running drive in which the frequency of the RF is modified to obtain a matching impedance. In the former case, the matching network is usually electromechanical and so it is slow to respond to changes in conditions. In the latter case, the free running generators automatically modify their frequency in response to changes in the load. The change in frequency causes a change in power delivered to the plasma, which is undesirable, but this may be compensated for by the instrument controller which may monitor the voltage and current driven through the coil.

It has been found that controlling the plasma power in this way does not however fully stabilize the detected optical and mass signals from sample material. Whilst the plasma power may be maintained constant to a high degree, the temperature of the plasma may change due to changes in the temperature or pressure of one or more of the gas flows fed into the torch, for example, or by the introduction of a different sample. Chemical and matrix interferences are a function of temperature therefore controlling the temperature rather than the power allows more accurate corrections to be applied.

An improved method of plasma control for an ICP-OES instrument was described in Japanese patent application JP06109639A. This method attempted to monitor the emission intensity of the plasma by monitoring the intensity of a single optical line and using a feedback system to control the RF generator power output so that the monitored line intensity remained constant. However the present inventors have found that RF power control to maintain intensity of a single line is sensitive to attenuation of light in the optical path between the plasma and the detector. The transmission of optical emission from the plasma varies over time due to contamination of optical elements, and this method of plasma control is unsuitable to provide significant benefits over other prior art methods involving RF power control.

Against this background the present invention has been made.

SUMMARY OF THE INVENTION

According to a first embodiment of the present invention there is provided a method of controlling the temperature of a plasma for spectrometry in which the intensities of two spectral lines of radiation emitted by the plasma are measured, and the power provided to sustain the plasma is adjusted so that the ratio of the intensities remains substantially constant.

According to a second embodiment of the present invention there is provided a spectrometer comprising a plasma generator, a wavelength selector, and a controller connected to the plasma generator and configured to control the power provided to sustain a plasma, the control being in response to a signal derived by the wavelength selector from the ratio of the intensities of two spectral lines of radiation emitted by the plasma when the spectrometer is in use.

The invention provides an improved method and apparatus for controlling the temperature of the plasma, providing greater signal stability. Preferably the two spectral lines of radiation emitted by the plasma are spectral lines from the same element; for example, the element may be an element present in the gas used to sustain the plasma, or it may be an element present in an internal standard introduced into the plasma. Where optical emissions from ionized elements are to be measured, stability of the temperature is important as it affects the ionization efficiency. Preferably one of the two spectral lines of radiation measured using the method of the invention is a spectral line from an ionized element, hence preferably one of the spectral lines is from an element in atomic form and the other spectral line is from an element in ionic form.

Alternatively, at low plasma powers, some elements may not have appreciable concentrations of ionized species present in the plasma. In these circumstances it may be preferable that both spectral lines are from an element which is not present in ionic form in the plasma at a relative concentration to the unionized form of greater than 1%. A more accurate method of controlling the temperature of the plasma is thereby achieved as a ratio of two similar intensities where both the intensities are well above the noise limit provides a more precise control signal.

Advantageously, by using more than two lines spread over the wavelength range of the instrument it is possible to not only maintain a constant plasma temperature but also to diagnose wavelength-dependent transmission problems in an ICP-OES spectrometer, such as may be caused, for wavelengths below 190 nm, by the presence of oxygen in the wavelength selector. Hence preferably one of the spectral lines is of a wavelength below 190 nm.

To facilitate stable and precise feedback control of the power provided to sustain the plasma, preferably the ratio of the intensities of the two measured spectral lines of radiation emitted by the plasma and which are used to control the power is between 0.1 and 10.

Preferably the power provided to sustain the plasma is adjusted after any changes to the gases or sample admitted to the plasma, hence preferably the intensities of two spectral lines of radiation emitted by the plasma are measured and the power provided to sustain the plasma is adjusted after sample has been admitted to the plasma and immediately preceding sample analysis. For an increased precision of analysis more preferably the power provided to sustain the plasma is adjusted whilst sample analysis proceeds, hence preferably whilst sample analysis proceeds, the intensities of two spectral lines of radiation emitted by the plasma are measured multiple times and the power provided to sustain the plasma is adjusted multiple times.

Where complex spectra are produced it may be desirable to control the power provided to sustain the plasma using a combination of several different ratios of spectral lines of radiation. Preferably the intensities of more than two spectral lines of radiation emitted by the plasma are measured, and the power provided to sustain the plasma is adjusted so that more than one ratio of the intensities remains substantially constant, in which case the power control is in response to a signal derived by the wavelength selector from a ratio of intensities derived from more than two spectral lines of radiation emitted by the plasma when the spectrometer is in use.

Preferably the ratio of intensities, whether two or more intensities are used, remains constant within +/−2%. Prior art methods, under carefully controlled and optimized conditions, may just achieve such stability levels. However the present invention will allow such stability to be achieved over a wider range of conditions, and, with suitably intense lines, can be improved to approximately +/−1%. Prior art methods are unable to achieve a stability of the ratio of intensities to +/−1% without experimentation to find to the most stable power, and such prior art methods still suffer from variations in stability in response to varying sample compositions.

The wavelength selector may be any type of optical element or combination of optical elements which selects and detects two or more spectral lines of radiation. In one preferred embodiment the wavelength selector comprises a dispersive element and a detector system, the dispersive element configured to disperse the radiation emitted by the plasma onto the detector system, the combination of the dispersive element and the detector system providing the wavelength selector. This embodiment is particularly suitable for use in ICP-OES and MIP-OES systems as the spectrometer typically already comprises a dispersive element and a detector system.

In another preferred embodiment, the wavelength selector comprises two optical filters and a detector system, one optical filter for transmitting a first optical wavelength onto the detector system, the other optical filter for transmitting a second optical wavelength onto the detector system, the combination of the two optical filters and the detector system providing the wavelength selector. The embodiment utilizing the combination of two optical filters and a detector system to provide the wavelength selector is relatively low cost and is particularly suitable for use with ICP-MS and MIP-MS systems which do not ordinarily already comprise an optically dispersive element and detector system.

Preferably the wavelength selector comprising a detector system includes a detector system which comprises a non-destructive readout arrangement. A non-destructive readout arrangement enables the intensities of two spectral lines of radiation emitted by the plasma to be measured multiple times whilst, for example, sample analysis proceeds.

In the case of an inductively coupled plasma, preferably, in order to control the temperature of the plasma rapidly and therefore to cope with high frequency changes to the plasma temperature, the power provided to sustain the plasma is generated using a free running generator in which the frequency of RF power is altered in order to change the power induced in the plasma.

As will be appreciated, the present invention provides apparatus and a method for controlling the temperature of an inductively coupled plasma or a microwave induced plasma which may be utilized in either axial or radial viewing configurations in ICP-OES or MIP-OES.

The invention may be applied as a method or apparatus to control a microwave induced plasma or an inductively coupled plasma, and either plasma may be utilized within an optical emission spectrometer or a mass spectrometer.

DESCRIPTION OF THE DRAWINGS

FIG. 2a is a schematic diagram of a radially viewed embodiment of the invention. FIG. 2b is a schematic diagram of an axially viewed embodiment of the invention.

DETAILED DESCRIPTION OF THE INVENTION

Figure 1:
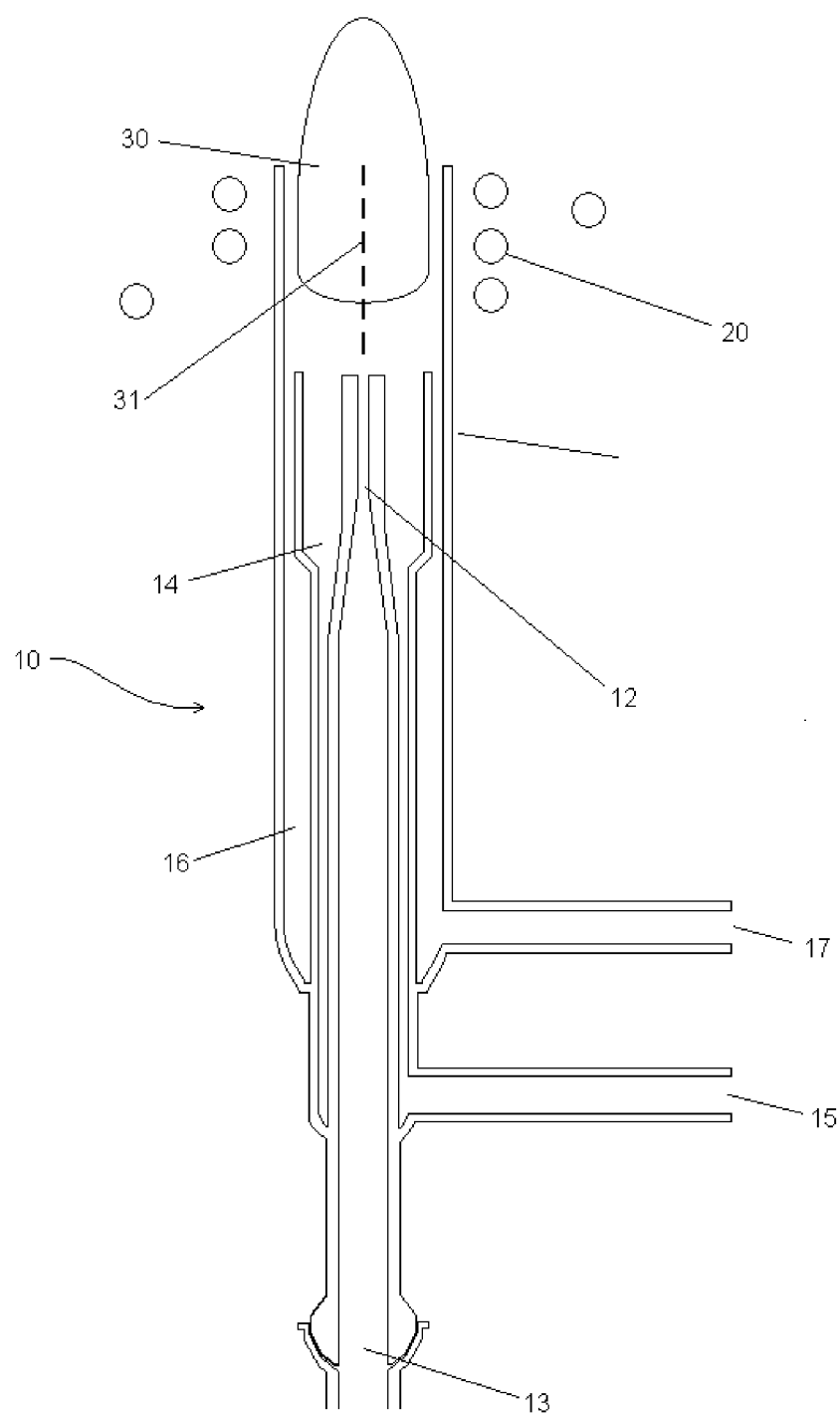
FIG. 1 is a schematic cross sectional diagram of a prior art torch and RF coil for an inductively coupled plasma for optical emission spectrometry or for mass spectrometry.

FIG. 1 is a schematic cross sectional diagram of a prior art torch and RF coil for an inductively coupled plasma for optical emission spectrometry or for mass spectrometry. Torch 10 comprises injector tube 12, auxiliary tube 14 and outer tube 16. Typically torch 10 is made of quartz glass or ceramic elements. The gas flow entering injector tube 12 at inlet 13 is known as an injection gas. Additional gas is supplied to auxiliary tube 14 via inlet 15, and this gas flow is known as auxiliary gas. A further gas flow is supplied to outer tube 16 via inlet 17, and this gas flow is known as the cool gas, as it is predominantly used to introduce a barrier of gas along the inside surface of outer tube 16. All three gases typically comprise argon. ICP coil 20 is used to couple RF power (typically, at 27 MHz) into a plasma 30 formed within and emerging from outer tube 16. Droplets or solid particles entering the inlet of torch 10 via injector tube 12 are transported in the injector gas into the axial region of the plasma 31 whereupon they desolvate and atomise and a proportion of the atoms liberated are ionized. Atoms and ions are excited in the plasma and relax to emit radiation.

Figure 2A:
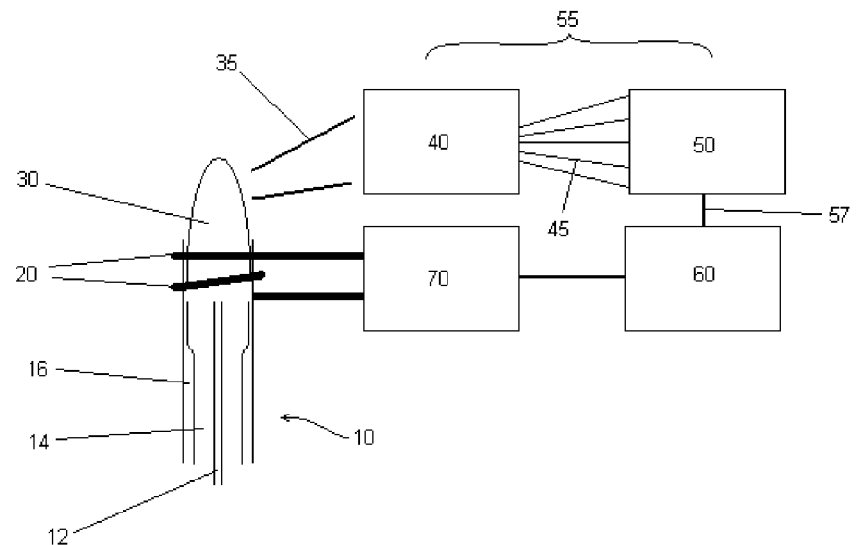
FIGS. 2a-2b show two embodiments of the present invention applied to an inductively coupled plasma.
Figure 2B:
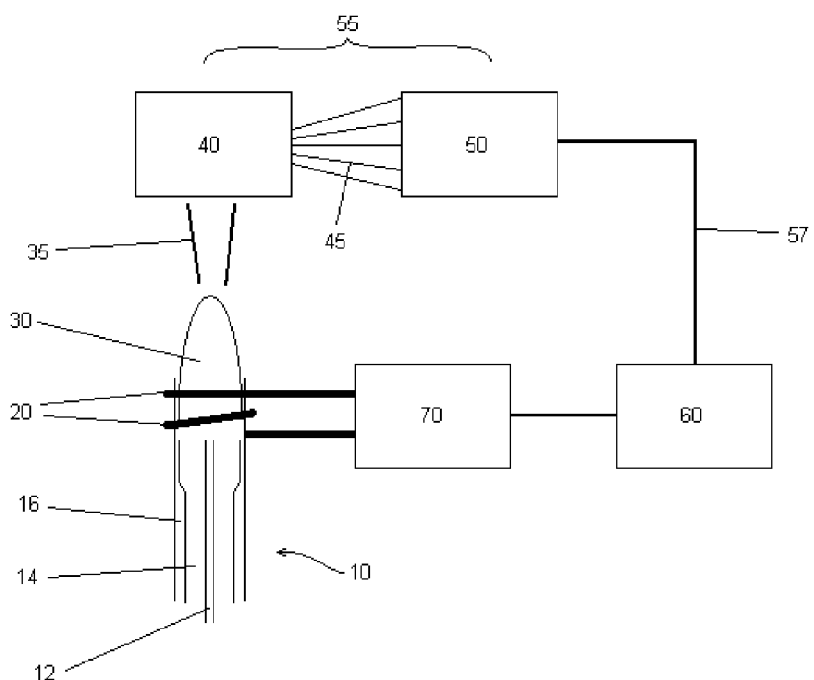

FIGS. 2a-2b show two embodiments of the present invention applied to an inductively coupled plasma. FIG. 2a is a schematic diagram of a radially viewed embodiment of the invention. FIG. 2b is a schematic diagram of an axially viewed embodiment of the invention. Torch 10 is similar to that described in relation to FIG. 1 and like components have the same identifiers. Plasma 30 emits optical radiation 35, a portion of which is passed to dispersive element 40 (which may be, for example, a grating, a prism or a combination of a grating and a prism). Dispersive element 40 disperses the optical emission and directs the dispersed radiation 45 onto detector system 50. Dispersive element 40 and detector system 50 together form a wavelength selector 55. The wavelength selector 55 produces a signal in response to the ratio of intensities of two (or more) spectral lines of radiation emitted by plasma 30, and the signal 57 is passed to controller 60. Controller 60 is connected to RF generator 70 and controller 60 controls the power provided by RF generator 70 to sustain plasma 30, the control being in response to signal 57.

FIGS. 2a-2b depict a dispersive element 40 and detector system 50 which together form wavelength selector 55. In alternative embodiments wavelength selector 55 comprises two or more optical filters chosen to transmit different wavelengths of radiation and arranged so that radiation falls upon a detector system. By this means the optical filters and the detector system together form an alternative wavelength selector to that depicted in FIGS. 2a-2b. All other components may remain the same.

By the apparatus thus described in relation to FIGS. 2a-2b, the method of controlling the temperature of an inductively coupled plasma for optical emission spectrometry or for mass spectrometry may be performed, in which the intensities of two spectral lines of radiation emitted by the plasma are measured, and the power provided to sustain the plasma is adjusted so that the ratio of the intensities remains substantially constant.

Similar arrangements to those depicted in FIGS. 2a-2b may be created in relation to a microwave induced plasma. The details of the torch construction and the means for transferring power to the plasma gas differ, but other features remain the same.

As used herein, including in the claims, unless the context indicates otherwise, singular forms of the terms herein are to be construed as including the plural form and vice versa. For instance, unless the context indicates otherwise, a singular reference, such as "a" or "an" (e.g. an electron multiplier, a photon detector etc.) means "one or more" (e.g. one or more electron multipliers, one or more photon detectors etc.).

Throughout the description and claims of this specification, the words "comprise", "including", "having" and "contain" and variations of the words, for example "comprising" and "comprises" etc, mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

The invention claimed is:

1. A method of controlling the temperature of a plasma for spectrometry, comprising:
   measuring the intensities of two spectral lines of radiation emitted by the plasma; and
   adjusting the power provided to sustain the plasma so that a ratio of the intensities remains substantially constant.

2. The method of claim 1 wherein the two spectral lines of radiation emitted by the plasma are spectral lines from the same element.

3. The method of claim 2 wherein the element is an element present in the gas used to sustain the plasma.

4. The method of claim 2 wherein the element is an element present in an internal standard introduced into the plasma.

5. The method of claim 1 wherein one of the spectral lines is from an element in atomic form and the other spectral line is from an element in ionic form.

6. The method of claim 1 wherein both spectral lines are from an element which is not present in ionic form in the plasma at a relative concentration to the unionized form of greater than 1%.

7. The method of claim 1 wherein one of the spectral lines is of a wavelength below 190 nm.

8. The method of claim 1 wherein the ratio of the intensities is between 0.1 and 10.

9. The method of claim 1 wherein the intensities of two spectral lines of radiation emitted by the plasma are measured and the power provided to sustain the plasma is adjusted after sample has been admitted to the plasma and immediately preceding sample analysis.

10. The method of claim 1 wherein while sample analysis proceeds, the intensities of two spectral lines of radiation emitted by the plasma are measured multiple times and the power provided to sustain the plasma is adjusted multiple times.

11. The method of claim 1 wherein the intensities of more than two spectral lines of radiation emitted by the plasma are measured, and the power provided to sustain the plasma is adjusted so that more than one ratio of the intensities remains substantially constant.

12. The method of claim 1 wherein the ratio of intensities remains constant within +/−2%.

13. The method claim 1 wherein the plasma is an inductively coupled plasma.

14. The method of claim 1 wherein the plasma is a microwave induced plasma.

15. The method of claim 1 wherein the plasma is utilized in an optical emission spectrometer.

16. The method claim 1 wherein the plasma is utilized in a mass spectrometer.

17. A spectrometer comprising a plasma generator, a wavelength selector, and a controller connected to the plasma generator and configured to control the power provided to sustain a plasma, the control being in response to a signal derived by the wavelength selector from the ratio of the intensities of two spectral lines of radiation emitted by the plasma when the spectrometer is in use.

18. The spectrometer of claim 17 wherein the wavelength selector further comprises a dispersive element and a detector system, the dispersive element configured to disperse the radiation emitted by the plasma onto the detector system.

19. The spectrometer of claim 17 wherein the wavelength selector comprises two optical filters and a detector system, one optical filter for transmitting a first optical wavelength onto the detector system, the other optical filter for transmitting a second optical wavelength onto the detector system.

20. The spectrometer of claim 17, wherein the wavelength selector comprises a detector system having a non-destructive readout arrangement.

21. The spectrometer of claim 17 wherein the control is in response to a signal derived by the wavelength selector from a ratio of intensities derived from more than two spectral lines of radiation emitted by the plasma when the spectrometer is in use.

22. The spectrometer of any of claim 17 wherein the plasma generator is an inductively coupled plasma generator.

23. The spectrometer of claim 17 wherein the power provided to sustain the plasma is generated using a free running inductively coupled plasma generator in which the frequency of RF power is altered in order to change the power induced in the plasma.

24. The spectrometer of claim 17 wherein the plasma generator is a microwave induced plasma generator.

25. The spectrometer of claim 17 wherein the spectrometer comprises an optical emission spectrometer.

26. The spectrometer of claim 17 wherein the spectrometer comprises a mass spectrometer.

* * * * *